(12) United States Patent
Bai et al.

(10) Patent No.: US 9,066,072 B2
(45) Date of Patent: Jun. 23, 2015

(54) SYSTEMS AND METHODS FOR CALIBRATING IMAGE SENSORS

(75) Inventors: Yingjun Bai, San Jose, CA (US); Brian Keelan, Boulder Creek, CA (US); Gennadiy Agranov, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 871 days.

(21) Appl. No.: 12/839,741

(22) Filed: Jul. 20, 2010

(65) Prior Publication Data

US 2012/0019669 A1    Jan. 26, 2012

(51) Int. Cl.
*H01L 27/146* (2006.01)
*H04N 1/62* (2006.01)
*H04N 9/04* (2006.01)
*H04N 17/00* (2006.01)

(52) U.S. Cl.
CPC ........ *H04N 17/002* (2013.01); *H01L 27/14632* (2013.01); *H04N 1/628* (2013.01); *H04N 9/045* (2013.01)

(58) Field of Classification Search
CPC .......... H04N 1/00002; H04N 1/00087; H04N 5/35563; H01L 27/14621
USPC .................................. 348/187, 175
See application file for complete search history.

(56) References Cited

U.S. PATENT DOCUMENTS

| | | | |
|---|---|---|---|
| 4,590,520 A * | 5/1986 | Frame et al. ................. | 348/616 |
| 5,396,080 A * | 3/1995 | Hannotiau et al. ........ | 250/559.28 |
| 5,699,440 A * | 12/1997 | Carmeli ...................... | 382/100 |
| 6,031,618 A * | 2/2000 | Wang ........................... | 356/419 |
| 7,023,472 B1 * | 4/2006 | Kang et al. .................. | 348/187 |
| 7,068,303 B2 * | 6/2006 | Zhang .......................... | 348/187 |
| 7,071,966 B2 * | 7/2006 | Lu et al. ....................... | 348/188 |
| 7,220,966 B2 * | 5/2007 | Saito et al. ................. | 250/341.6 |
| 7,479,982 B2 * | 1/2009 | Otani et al. .................. | 348/188 |
| 7,570,282 B1 * | 8/2009 | Kaplinsky ................... | 348/188 |
| 7,709,779 B2 * | 5/2010 | Hager ........................ | 250/214.1 |
| 7,893,972 B2 * | 2/2011 | Kaplinsky et al. ........... | 348/246 |
| 8,008,641 B2 * | 8/2011 | Harris et al. ............. | 250/559.41 |
| 8,514,322 B2 * | 8/2013 | Bai et al. ..................... | 348/362 |
| 8,537,256 B2 * | 9/2013 | Hiramoto et al. ........... | 348/275 |
| 2003/0184659 A1 * | 10/2003 | Skow ......................... | 348/223.1 |
| 2003/0222995 A1 * | 12/2003 | Kaplinsky et al. .......... | 348/247 |
| 2005/0068464 A1 * | 3/2005 | Pettitt et al. ................. | 348/690 |
| 2005/0261400 A1 * | 11/2005 | Yang et al. ..................... | 524/99 |
| 2006/0023229 A1 * | 2/2006 | Watkins et al. .............. | 356/601 |
| 2006/0055316 A1 * | 3/2006 | Wu et al. ..................... | 313/503 |
| 2006/0062562 A1 * | 3/2006 | Utagawa ..................... | 396/213 |

(Continued)

*Primary Examiner* — Brian Yenke
(74) *Attorney, Agent, or Firm* — Robert F. Hightower

(57) ABSTRACT

Systems and methods are provided for calibrating image sensors. In some embodiments, a processing module of an image system can automatically perform a self-calibration process after a production unit of an image sensor has been integrated into an end product system. For example, the processing module can calibrate a production unit based on one or more reference pixels of the production unit, where the one or more reference pixels have minimal color filtration. In some embodiments, the processing module may perform local calibrations by correcting specifically for spatial variations in a color filter array ("CFA"). In some embodiments, the processing module can perform global calibrations by correcting for optical density variations in the CFA. In some embodiments, a processing module can determine whether the cause of production variations is related to production variations of a CFA or production variations of an infrared ("IR") cutoff filter.

25 Claims, 6 Drawing Sheets

(56) References Cited

U.S. PATENT DOCUMENTS

| | | | |
|---|---|---|---|
| 2006/0221218 A1* | 10/2006 | Adler et al. | 348/266 |
| 2007/0045632 A1* | 3/2007 | Oliver et al. | 257/79 |
| 2007/0077228 A1* | 4/2007 | Acland et al. | 424/93.2 |
| 2007/0229666 A1* | 10/2007 | Berestov et al. | 348/187 |
| 2008/0218610 A1* | 9/2008 | Chapman et al. | 348/246 |
| 2010/0110275 A1* | 5/2010 | Mathieu | 348/360 |
| 2010/0320368 A1* | 12/2010 | Koskinen et al. | 250/226 |
| 2010/0320369 A1* | 12/2010 | Koskinen et al. | 250/226 |
| 2010/0321542 A1* | 12/2010 | Koskinen et al. | 348/273 |
| 2011/0298844 A1* | 12/2011 | Butler et al. | 345/690 |

\* cited by examiner

SYSTEMS AND METHODS FOR CALIBRATING IMAGE SENSORS

FIELD OF THE INVENTION

This is directed to systems and methods for calibrating image sensors.

BACKGROUND OF THE DISCLOSURE

An image system, such as a camera, can include an optical lens, an image sensor (e.g., a complementary metal-oxide-semiconductor ("CMOS") or charged coupled device ("CCD") sensor), and other digital processing circuitry. In some cases, an image sensor of the image system can include a color filter array ("CFA"), which can enable the image sensor to capture color signals. For example, different types of coating on the CFA may allow the CFA to pass a selective narrow band of light while blocking other portions of the visible light spectrum. The color filtering provided by the CFA thereby limits the wide sensitivity of the image sensor to the visible light spectrum.

For each type of image system, a spectral curve of the CFA can be defined. In addition, the color response of the image sensor can be characterized. Following the characterization, the image system can perform additional digital processing. In some cases, the digital processing performed by the image system can include an optimization process for designing a color correction matrix ("CCM"). As a result, CCM and other color adjustment procedures in a digital processing pipeline can jointly transform an image sensor output to a final output for the user.

Typically, during the manufacturing of image sensors, a per module calibration process can be performed on red-green-blue ("RGB") image sensors. Unfortunately, the light source that is used during the calibration process needs to have uniform brightness. Moreover, one or more special targets are also required during the calibration process. Such calibration processes can slow down manufacturing and add cost.

DETAILED DESCRIPTION OF THE DISCLOSURE

In the present invention, a system can use one or more clear or neutral density pixels of an image sensor to correct for color filter array ("CFA") deviations from an intended target behavior. The clear or neutral density pixels, which are free from the types of production variations that affect CFA materials, can permit much simpler correction than would otherwise be possible in conventional systems. In particular, special targets and perfectly uniform lighting are no longer required. Instead, reasonably uniform surfaces, such as a sheet of white paper, or even one or more memory colors, such as blue sky, can be used. In addition, the sensor calibration can be accomplished after sensor manufacture such as, for example, during routine use of the camera, thereby avoiding extra time and expense.

Figure 1:
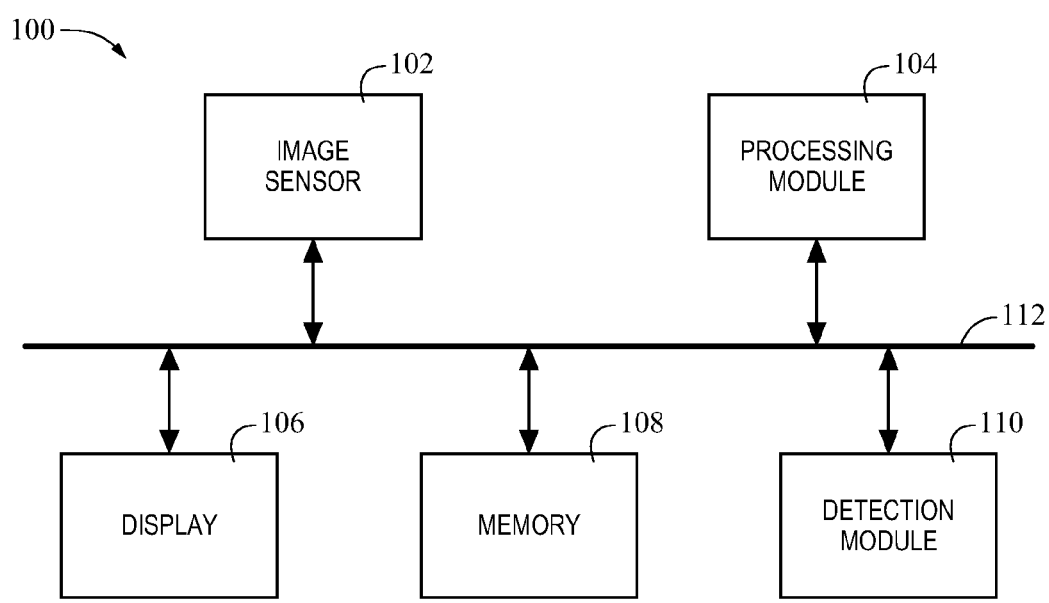
FIG. 1 is a schematic view of an image system configured in accordance with various embodiments of the invention.

FIG. 1 is a schematic view of an illustrative image system 100 configured in accordance with various embodiments of the invention. Image system 100 can be any suitable system that utilizes an image sensor (embodied here as image sensor 102) and is controlled generally by processing module 104. For example, image system 100 can be any suitable type of electronic device (e.g., a mobile or cellular phone, a portable computer, a desktop computer, and/or any other suitable electronic device) that includes a camera, such as a computer camera, a still camera, a surveillance camera, or a portable video camera. Image system 100 can also include any other components in a typical electronic device with a camera or a standalone camera system. These other components are not depicted in FIG. 1 in order to avoid any distractions from embodiments of the invention.

Image sensor 102 can capture one or more images (e.g., capture data corresponding to a streaming image). For example, image sensor 102 can include any combination of lenses and arrays of cells (e.g., a complementary metal-oxide-semiconductor ("CMOS") sensor cells or charged coupled devices ("CCDs")) for capturing light. In some embodiments, image sensor 102 can include color filter arrays ("CFAs"), which can enable the image sensor to capture color signals. Image sensor 102 will be described in more detail in connection with FIG. 2.

Processing module 104 can control the operation and various functions of image system 100. For example, processing module 104 can process data generated by image sensor 102, and can perform any suitable operations based on this data such as, for example, calibration processing, noise reduction processing, focus recovery processing, and/or any other suitable types of digital processing. As another example, as described in greater detail below, processing module 104 can direct display 106 to present information to a user (e.g., a request to capture an image). As yet another example, processing module 104 can store any suitable data (e.g., data generated by image sensor 102 and/or data processed by processing module 104) in memory 108. As a further example, processing module 104 can trigger detection module 110 to detect the presence of one or more faces in images captured by image sensor 102.

Image sensor 102 and processing module 104 may be implemented using any suitable combination of hardware and software. Processing module 104 may include, for example, one or more processors, microprocessors, ASICS, FPGAs, or any suitable combination of hardware and software. In some embodiments, image sensor 102 can be implemented substantially all in hardware (e.g., as a system-on-a-chip ("SoC")). This way, image sensor 102 can have a small design that minimizes the area occupied on image system 100. In addition, image sensor 102 may have circuit components designed to maximize the speed of operation.

Display 106 can provide a user interface for a user to interact with image system 100. In some embodiments, display 106 can represent visual media (e.g., graphics such as videos, photographs, and text) to a user. Display 106 can include, for example, a liquid crystal display ("LCD"), a light emitting diode ("LED") display, a touch screen display, or any other type of display. For instance, in one implementation, display 106 can be a LCD on a digital camera.

Memory 108 can include any combination of volatile and non-volatile memory modules for storing information in image system 100, such as cache memory, Flash memory, random access memory ("RAM") (e.g., double data rate ("DDR") RAM and/or static random access memory ("SRAM")), read only memory ("ROM"), a hard drive, an EPROM, EEPROM, or any combination thereof. Memory 108 can operate as the main memory for processing module 104, can store the firmware/software used by processing module 104, and can provide mass storage for image system 100. For example, memory 108 may be used by processing module 104 to store one or more images and/or any suitable data associated with the one or more images. For instance, memory 108 can store any data generated by processing module 104 such as one or more color ratios, gain maps, one or more responses of image sensor 102, any intermediate or results data generated by a calibration process, any other suitable data, and/or any combination thereof.

Detection module 110 can include any suitable component(s) capable of detecting the presence of one or more features (e.g., faces, trees, sky, etc.) in an image. Detection module 110 can include, for example, one or more face/object detection modules, face/object recognition modules, and/or any combination thereof.

Bus 112 may provide a data transfer path for transferring data to, from, or between image sensor 102, processing module 104, display 106, memory 108, detection module 110, and some or all of the other components of image system 100.

Figure 2:
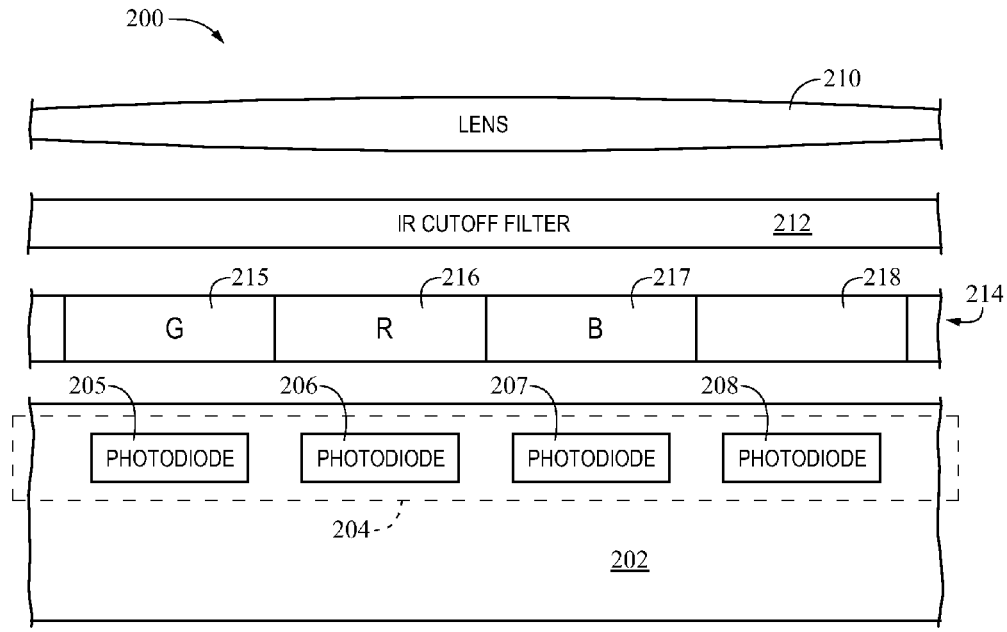
FIG. 2 is a schematic view of a processing module configured in accordance with various embodiments of the invention.

In some embodiments, during the manufacturing of image system 100, many production units of image system 100 may be produced. Thus, each production unit of image system 100 may include an image sensor (e.g., image sensor 102) with certain production variations. For example, FIG. 2 is a cross-sectional view of an illustrative image sensor 200 in accordance with various embodiments of the invention. Image sensor 200 can be the same as or substantially similar to image sensor 102 of FIG. 1. In some embodiments, image sensor 200 can be a production unit of an image sensor (e.g., image sensor 102 of FIG. 1) and/or an image system (e.g., image system 100 of FIG. 1).

For the sake of simplicity, it will be understood that not all of the layers of an image sensor are shown in FIG. 2. For example, there may be metal interconnect layers formed between the layers shown and additional dielectric layers for insulation purposes. It will also be understood that image sensor 200 of FIG. 2 can include additional photodiodes not shown in FIG. 2. It will further be understood that FIG. 2 is not drawn to scale.

Image sensor 200 can include substrate 202 that can incorporate multiple photodiodes 204 such as, for example, photodiodes 205-208. Photodiodes 204 can be capable of converting incoming light into electrical light signals. For example, light entering lens 210 can pass through IR cutoff filter 212 and CFA 214 before falling on photodiodes 204. Persons skilled in the art will appreciate that photodiodes 204 can include one or more single layer photodiodes, dual layer photodiodes, and/or any combination thereof. As used herein, a "pixel" can refer to a photodiode and any transistors capable of responding to one or more wavelengths of light. Correspondingly, a "pixel array" can refer to an array of such pixels in an image sensor.

Lens 210 can include any suitable lens such as, for example, a single lens or multiple micro-lenses. For instance, in one configuration, each micro-lens can be formed over one or more corresponding photodiodes 204.

IR cutoff filter 212 can limit the effects of IR light on the responses of photodiodes 204. For example, IR cutoff filter 212 can block undesirable IR light from reaching photodiodes 204 by filtering out light with wavelengths that are longer than the wavelengths of visible light. In some embodiments, this filtering of IR light can be accomplished via different types of coating on IR cutoff filter 212. Unfortunately, during the manufacture of multiple production units of an image sensor, there may be production variations in the coatings of different IR cutoff filters, which may subsequently produce different responses in the photodiodes. As a result, different production units of an image sensor may have different sensor responses (e.g., production sensor responses) due to production variations in the coatings of IR cutoff filters.

As shown in FIG. 2, CFA 214 can include one or more filter elements 215-217. Each of filter elements 215-217 can limit the visible light spectrum received by each of photodiodes 204 (e.g., photodiodes 205-207). In some embodiments, each of filter elements 215-217 can produce a desired color response in each of photodiodes 205-207 by blocking passage of a particular spectrum of light. For example, filter element 215 may produce a green color response for photodiode 205. As another example, filter element 216 may produce a red color response for photodiode 206. As yet another example, filter element 217 may produce a blue color response for photodiode 207. As a result, each of photodiodes 205-207 can correspond to the green, red, and blue color channels, respectively, and pixels associated with photodiodes 205-207 can be referred to as color pixels.

Persons skilled in the art will appreciate that CFA 214 can include any suitable number, type, or arrangement of filter elements. For example, in some configurations, the filter elements of CFA 214 may be arranged in a Bayer pattern. Moreover, in addition to or instead of green, red, and/or blue filter elements 215-217, CFA 214 can include any suitable types of filter elements such as, for example, magenta, yellow, cyan, and/or luminance filter elements.

In order to perform the filtering of the visible light spectrum, the one or more filter elements 215-217 may be coated on to CFA 214. However, due to production variations, a CFA coating may deviate from its ideal optical density (which may be found in a target unit of an image sensor and/or an image system). In some embodiments, optical density variations may be spatially invariant, and may therefore be referred to as global color sensitivity biases. Optical density variations can cause imperfect matching of the color responses of photodiodes 204, which may in turn compromise white balance operations in an image system. Optical density variations may result from any number of factors including, for example, variations in the thickness of the CFA coating during a deposition process and/or variations in the shapes of one or more filter elements (e.g., filter elements 215-217).

In addition to or instead of optical density variations, CFA coating may include other types of production variations that are inhomogeneous and are spatially variant. These spatial variations can be referred to as local color sensitivity biases, and can include, for example, radial streaks, waves, spokes, and/or other low spatial frequency non-uniformities in the thickness of the CFA across a pixel array. Similar to optical density variations, spatial variations may also be formed during the CFA development process. Furthermore, in some cases, as the variation frequency of the spatial variations reaches zero, spatial variations can transform to optical density variations.

In some embodiments, one or more portions (e.g., portion 218) of CFA 214 can include a material with minimal color filtration. For example, portion 218 may be coated with a clear coating material that is transparent for the entire visual spectral range, a neutral density coating material that attenuates light, any other suitable type of material, and/or any combination thereof. In some cases, the neutral density coating material used for portion 218 may need to be created using a different manufacturing process than the process used to create the color filter elements of CFA 214 (e.g., filter elements 215-217). One or more photodiodes 204 corresponding to portion 218 can capture signals passing through portion 218. Due to the minimal color filtration of portion 218, pixels associated with these photodiodes (e.g., photodiode 208) can be referred to as reference pixels of a pixel array. As a result, reference pixels, which may be more sensitive to light as compared to the color pixels in the pixel array, can be used to capture images at low light levels.

Since the reference pixels are unaffected by the CFA coating process and therefore do not contain the production variations (e.g., optical density variations and/or spatial variations) found in color pixels, an image system can use the reference pixels as a reference channel to calibrate out imperfections in the CFA coating. This way, an image system (e.g., image system 100 of FIG. 1) can calibrate for production variations in order to reduce undesirable patterns within one or more color pixels. For example, the image system can use the reference channel to calibrate for production variations corresponding to a particular color channel such as, for instance, a red, green, blue, magenta, yellow, and/or cyan channel. As will be discussed in greater detail below, an image system may perform global calibration for optical density variations and local calibration for spatial variations.

Calibrating for production variations can improve both the quality and yield of image systems utilizing image sensors. For example, the color reproduction process is generally assumed to be the same for all production units of an image system (e.g., image system 100 of FIG. 1). In other words, in order to generate consistent color rendering, it is assumed that all production units of an image system have identical CFA spectra that also match the CFA spectrum of a target unit (e.g., a design unit) of the image system. As discussed previously, however, production variations (e.g., production variations in CFAs and/or IR cutoff filters) are introduced in various units of an image system during the manufacturing process.

As a quality control measure, production units of an image system are evaluated based on how far apart their CFA spectra are from the CFA spectrum of a target unit. Thus, some production units are accepted and assigned quality grades because their CFA spectra are within a particular tolerance threshold. Other production units, however, are discarded because their CFA spectra fall outside the tolerance threshold. As a result, if the tolerance threshold of an image sensor or image system is particularly tight, the overall yield of production units of that sensor or system is significantly lowered. Hence, post production calibration capable of compensating for production variations of image sensors can improve the overall yield of an image sensor and/or an image system.

Figure 3:
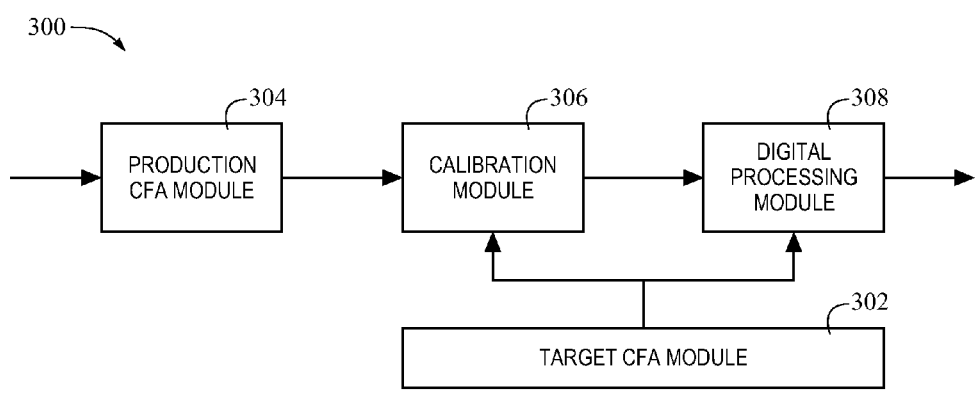
FIG. 3 is a cross-sectional view of an illustrative image sensor in accordance with various embodiments of the invention.

Referring now to FIG. 3, processing module 300 is shown for calibrating images captured by an image sensor (e.g., image sensor 102 of FIG. 1 or image sensor 200 of FIG. 2). In some embodiments, the image sensor can be a production unit of the image sensor and can include a production CFA (e.g., CFA 214 of FIG. 2) and a pixel array (e.g., a pixel array associated with photodiodes 204 of FIG. 2). Processing module 300 can be the same as or substantially similar to processing module 104 of FIG. 1. Persons skilled in the art will appreciate that processing module 300 can include additional components not shown in FIG. 3. As used herein, and depending on context, an "image sensor" can refer to a production unit of an image sensor and/or a design unit of an image sensor.

In some embodiments, processing module 300 can include target CFA module 302, production CFA module 304, calibration module 306, and digital processing module 308. Target CFA module 302, production CFA module 304, and calibration module 306 can generate data based at least in part on one or more reference pixels of a production unit, where the one or more reference pixels have minimal color filtration. For example, the one or more reference pixels may be one or more clear pixels and/or one or more neutral density pixels of an image sensor (e.g., a pixel associated with photodiode 208 of FIG. 2).

Because the one or more reference pixels may be more sensitive to light as compared to one or more color pixels of a pixel array, the one or more reference pixels can be associated with a reference integration time (e.g., reference exposure time) that is different than a color integration time (e.g., color exposure time) that is associated with the color pixels. For example, an image system (e.g., image system 100 of FIG. 1) may expose the one or more reference pixels to light for a shorter amount of time as compared to the one or more color pixels in order to avoid over-exposure of the reference pixels.

In general, spatial variations cannot be easily removed by digital processing module 308 because the associated artifacts tend to have different spatial frequencies and irregular shape. Thus, in some embodiments, processing module 300 can perform local calibration by correcting specifically for spatial variations in the coating of a CFA using one or more reference pixels.

For example, for an area in a calibration image that is relatively uniform and neutral in color (e.g., when input light is free of high-frequency spatial variations), calibration module 306 can produce a gain map that reflects spatial variations in the CFA coating (e.g., the gain map can vary over one or more areas of an image). For instance, for each pixel position of a production unit of an image sensor, calibration module 306 can generate a gain map that includes a set of production color ratios according to:

$$[R_{prod}/C_{prod} \; G_{prod}/C_{prod} \; B_{prod}/C_{prod}] \quad (1),$$

where $R_{prod}$, $G_{prod}$, $B_{prod}$, and $C_{prod}$ can correspond to the production sensor responses of the production unit of the image sensor for the red, green, blue, and reference channels, respectively. For example, $R_{prod}$, $G_{prod}$, $B_{prod}$, and $C_{prod}$ can correspond to the unique responses of the red, green, blue, and reference pixels in a pixel array of the production unit of the image sensor.

Figure 4A:
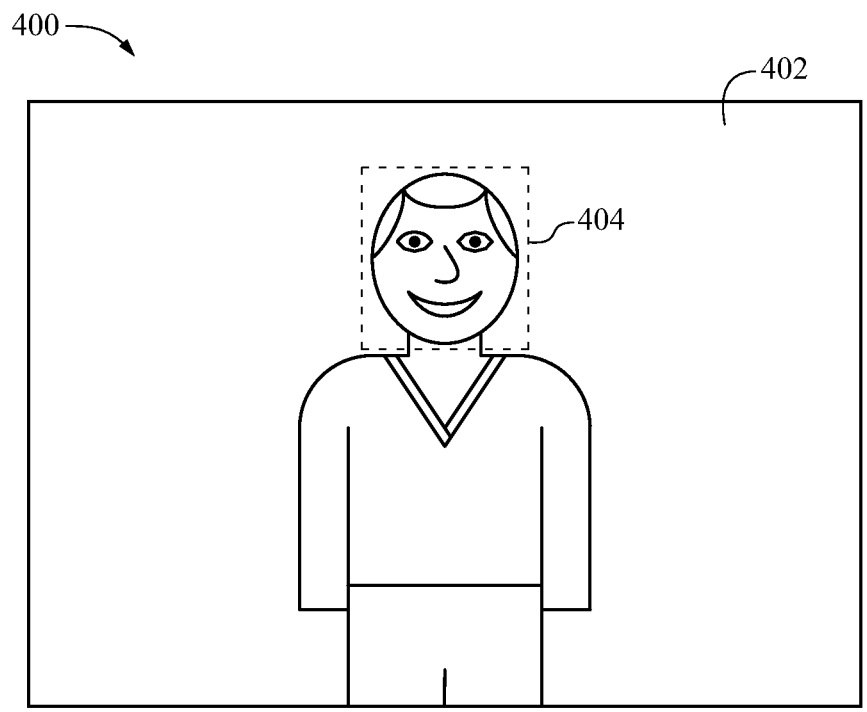
FIGS. 4A and 4B are illustrative images for image sensor calibration in accordance with various embodiments of the invention.

Calibration module 306 can select any suitable calibration image for generating the gain map. For example, as shown in FIG. 4A, image 400 is shown for selecting a calibration image. Image 400 may have been captured by a production unit of an image sensor (e.g., image sensor 102 of FIG. 1 and/or image sensor 200 of FIG. 2) of an image system (e.g., image system 100 of FIG. 1). Thus, as shown in image 400, a user may be taking a picture of a person against a uniform background (e.g., wall 402). In order to generate a calibration image, a processing module (e.g., processing module 104 of FIG. 1 and/or processing module 300 of FIG. 3) of the image system can prompt a user to take a picture of a relatively uniform surface. For example, the processing module can display a message prompting the user to take a picture of wall 402. In response to the user taking a picture of wall 402, a calibration module (e.g., calibration module 306 of FIG. 3) can calibrate for spatial variations and generate a gain map using Equation (1).

Persons skilled in the art will appreciate that the calibration image can be any suitable surface that is relatively uniform and neutral in color (e.g., wall, sea, white paper, etc.). Because the exact color of the calibration image and the presence of low-frequency non-uniformities (e.g., uneven lighting) in the calibration image do not affect the calibration process with respect to the reference pixels, a calibration module (e.g., calibration module 306 of FIG. 3) can also perform calibration using an out-of-focus image of a surface (e.g., an out-of-focus image of wall 402 of FIG. 4A).

Returning to FIG. 3, calibration module 306 can store the gain map that was generated using Equation (1) in memory (e.g., memory 108 of FIG. 1). In some embodiments, calibration module 306 can store the gain map as a gain image. For example, the gain map may be stored in an uncompressed pixel format. As another example, the gain map may be stored in a pixel format that has been compressed using a suitable method. In other embodiments, calibration module 306 can abstract and/or vectorize the gain map into any suitable mathematically expressible format. In further embodiments, calibration module 306 can store the gain map as one or more planes, where each plane can correspond to a particular color channel (e.g., a red, green, blue, or reference channel).

After the gain map has been stored, calibration module 306 can adjust for spatial variations of a production unit of the image sensor (e.g., spatial variations of a production CFA) using the stored gain map. For example, in response to receiving an image that has been captured by the production unit, calibration module 306 can adjust for the gains of each pixel of the image based on the stored gain map. As a result of the adjustment, the production sensor responses of a production unit can have little or no spatial variations for a relatively uniform area of the image. Correspondingly, the production sensor responses can be virtually identical to the target sensor responses of a target unit of the image sensor. It will be understood that, in addition to or instead of calibration module 306, the local calibration process can also be performed by any other suitable component(s) in processing module 300.

In some embodiments, after local color uniformities have been attained using the local calibration process, processing module 300 can perform a global calibration process. Persons skilled in the art will appreciate that instead of performing both local and global calibrations, processing module 300 can instead select to perform only one type of calibration.

In order to perform global calibrations, target CFA module 302 can first generate target data (e.g., a set of target color ratios) for a target unit of an image sensor with a target CFA, where the target data can correspond to a pre-determined input (e.g., a pre-determined memory color associated with a particular light source). As discussed previously, the target unit of the image sensor can include a target CFA without any optical density variations. The target data can therefore be based on the target sensor responses (e.g., the unique responses of one or more reference pixels and one or more color pixels of the target unit of the image sensor) to the pre-determined input.

Because the data calibrations can be performed using relative color sensitivities, target CFA module 302 can generate target color ratios instead of using the intensity values of the pixels. For example, target CFA module 302 can generate a set of target color ratios for a pre-determined memory color based on:

$$[R_{target}/C_{target} G_{target}/C_{target} B_{target}/C_{target}] = [\text{Gain}\_r\ \text{Gain}\_g\ \text{Gain}\_b] \quad (2),$$

where $R_{target}$, $G_{target}$, $B_{target}$, and $C_{target}$ can correspond to target sensor responses for the red, green, blue, and reference channels, respectively, and Gain_r, Gain_g, and Gain_b can correspond to the target color ratios for the red, green, and blue channels, respectively. In some embodiments, $R_{target}$, $G_{target}$, $B_{target}$, and $C_{target}$ can correspond to average pixel values for the red, green, blue, and reference channels, respectively. After target CFA module 302 generates the target data, target CFA module 302 can pass the target data to calibration module 306 and digital processing module 308.

Similarly, for the same pre-determined input (e.g., a pre-determined memory color associated with a particular light source), production CFA module 304 can generate production data (e.g., a set of production color ratios) for a production unit of an image sensor. The production unit of the image sensor can include a production CFA (e.g., CFA 214 of FIG. 2) with optical density variations. The production data can therefore be based on the production sensor responses (e.g., the unique responses of one or more reference pixels and one or more color pixels of the production unit of the image sensor) to the pre-determined input.

For example, production CFA module 304 can generate a set of production color ratios for a pre-determined memory color based on:

$$[R_{prod}/C_{prod} G_{prod}/C_{prod} B_{prod}/C_{prod}] = [M\_r\ M\_g\ M\_b] \quad (3),$$

where $R_{prod}$, $G_{prod}$, $B_{prod}$, and $C_{prod}$ can correspond to production sensor responses for the red, green, blue, and reference channels, respectively, and M_r, M_g, and M_b can correspond to the production color ratios for the red, green, and blue channels, respectively. In some embodiments, $R_{prod}$, $G_{prod}$, $B_{prod}$, and $C_{prod}$ can correspond to average pixel values for the red, green, blue, and reference channels. After production CFA module 304 generates the production data CFA module 304 can pass the production data to calibration module 306.

Persons skilled in the art will appreciate that because processing module 300 can use average pixel values for one or more channels of a pixel array, any suitable type of pixel arrangement can be used for the calibration process. In some embodiments, processing module 300 can use a pixel arrangement that provides for high quality color interpolation of red-green-blue-clear ("RGBC") signals. For instance, the one or more reference pixels can be imaging pixels that are embedded in a pixel array. These reference pixels can therefore be used to accumulate an image along with other color pixels in the pixel array. In other embodiments, the one or more reference pixels can be calibration pixels that are embedded in an image sensor (e.g., a production unit and/or target unit of an image sensor). For example, the one or more reference pixels may be embedded as a fifth channel in between a regular color pixel arrangement. In some cases, these calibration pixels can be reserved for the calibration process and/or other non-imaging purposes.

Persons skilled in the art will appreciate that target CFA module 302 and production CFA module 304 can generate data (e.g., target data and production data) at any suitable time. For example, target CFA module 302 may generate target data offline prior to the initiation of a calibration process (e.g., a global calibration process) by processing module 300. In contrast, production CFA module 304 can generate production data in real time while processing module 300 is calibrating one or more images.

In some embodiments, in response to receiving data from target CFA module 302 and production CFA module 304, calibration module 306 can perform global calibration for images captured by the production unit of the image sensor. For example, based on the target and production color ratios, calibration module 306 can determine and compensate for the deviation between the production sensor responses of the production unit and the target sensor responses of the target unit. For instance, for a pre-determined memory color of an image captured by a production unit of the image sensor, calibration module 306 can adjust the values of one or more color pixels of the production unit of the image sensor based on:

$$R_{adjusted} = R*Gain\_r/M\_r \quad (4),$$

$$G_{adjusted} = G*Gain\_g/M\_g \quad (5),$$

$$B_{adjusted} = B*Gain\_b/M\_b \quad (6),$$

where R, G, and B can correspond to the production sensor responses for the red, green, and blue channels, respectively, and $R_{adjusted}$, $G_{adjusted}$, an are the and $B_{adjusted}$, are the adjusted production sensor responses for the red, green, and blue channels, respectively. For example, R, G, and B can correspond to average pixel values for the red, green, and blue channels. Thus, in both the local and global calibration processes, processing module 300 can adjust for production variations associated with one or more color pixels of the production unit of the image sensor using data based at least in part on one or more reference pixels.

In some embodiments, in response to performing one or more calibration processes (e.g., local and/or global calibrations), calibration module 306 can perform gain adjustments for one or more pixels (e.g., reference pixels and color pixels) of the production unit. For example, the gain adjustments can include calibration gains, which can compensate for changes (e.g., local and/or global pixel signal-to-noise ratio ("SNR") changes) introduced during the calibration process.

After calibration module 306 has performed one or more calibration processes and/or gain adjustments, calibration module 306 can pass the adjusted production sensor responses and/or the calibration gains to digital processing module 308. In some cases, in response to receiving calibration gains from calibration module 306, one or more modules in digital processing module 308 can use the calibration gains to perform their respective functions. For example, a noise reduction component in digital processing module 308 may require the calibration gains as input parameters to a noise model.

As a result of the one or more calibrations, digital processing module 308 can be shielded from any production variations in a production unit of an image sensor. Instead, digital processing module 308 can assume that all production units of the image sensor have identical imaging behavior. This can improve the overall performance of the image system because the parameters of digital processing module 308 can be designed and optimized for a target sensor response corresponding to a target unit of the image sensor. Therefore, even though particular production units of the image system may have production sensor responses that deviate substantially from a target design, digital processing module 308 can still achieve consistent color rendering. Moreover, using this calibration process, the tolerance threshold for accepting production units can be relaxed, thereby leading to increased production yields, lower average unit costs, and a higher gross margin.

Persons skilled in the art will appreciate that the one or more calibration processes can be performed at any suitable time. In some embodiments, processing module 300 can perform per module calibration while a production unit is being manufactured. Unfortunately, per module calibration can be expensive because each unit may need to be manually calibrated.

In other embodiments, processing module 300 can automatically perform a self-calibration process after a production unit of an image sensor has been integrated into an end product system (e.g., an image system such as, for instance, a cellular phone, a camera, a personal computer, etc.). However, because a known light source based calibration can be difficult to achieve in an end product system, in order to perform a global calibration process, processing module 300 may need to rely on one or more pre-determined memory colors (as discussed in connection with Equations (2) and (3)) that are relatively stable and predictable for a range of light sources.

The range of suitable light sources that are available for calibration may vary depending on the type of end product system. For example, for a portable camera or a cellular phone, one suitable light source can be daylight, which is reliably identifiable and also produces relatively stable color behavior. As another example, for a computer camera, a suitable light source can be a combination of fluorescent light, tungsten light, and/or the light emitted from a display. In some embodiments, processing module 300 can identify a suitable light source by detecting that the brightness level of an image captured by a production unit of an image sensor is above a pre-determined threshold.

Thus, in contrast to a system that requires uniform brightness and special targets during the calibration process, processing module 300 can calibrate for production variations without having to use a light source with uniform brightness or any special targets. Instead, image sensor calibrations can be performed using only uniformly-colored image areas and/or one or more memory colors. In some cases, the memory colors can be collected in an automatic or semi-automatic fashion.

For example, in response to detecting a suitable light source, processing module 300 can automatically begin a collection process by attempting to collect one or more memory colors in real time. Persons skilled in the art will appreciate that any suitable component(s) in processing module 300 can collect the one or more memory colors including, for example, target CFA module 302, production CFA module 304, and/or calibration module 306.

Persons skilled in the art will also appreciate that processing module 300 may not need to collect all possible memory colors before beginning the global calibration process. For example, depending on the type of image system that is being calibrated, only a subset of all possible memory colors may be available for capture. For instance, if the image system is a desktop or laptop computer with a camera, processing module 300 may use skin tone as one of the dominant memory colors because faces are more likely to be captured by an image sensor. On the other hand, if the image system is a portable camera or a camera phone, processing module 300 may attempt to use sky and/or foliage colors as memory colors because these colors may be more readily available. In some embodiments, the determination of which memory colors to collect may be pre-programmed into the image system prior to the start of the global calibration process. In other embodiments, processing module 300 can automatically determine which memory colors to collect depending on the memory colors that are found to be available during the collection process.

Processing module 300 can use any suitable approach to determine if a color in an image is a memory color that can be collected. In some embodiments, processing module 300 can automatically identify a memory color in an image based on whether the memory color satisfies one or more conditions. The one or more conditions can include, for example, an initial set of color ratios (e.g., [$R_{prod}/C_{prod}$, $G_{prod}/C_{prod}$, $B_{prod}/C_{prod}$, $R_{prod}/G_{prod}$, $B_{prod}/G_{prod}$]), a location and/or size within an image, a brightness level of the image, an exposure time, the texture of a portion of the image (e.g., color uniformity of the memory color), an output of a detection module (e.g., detection module 110 of FIG. 1), any other suitable condition(s), and/or any combination thereof.

For example, as shown in FIG. 4A, image 400 includes face 404, which may be captured by a production unit of an image sensor (e.g., image sensor 102 of FIG. 1 and/or image sensor 200 of FIG. 2). Thus, a processing module (e.g., processing module 104 of FIG. 1 and/or processing module 300 of FIG. 3) can detect that the skin tone of face 404 is in the middle tone and is relatively smooth. In response to the detection, the processing module can identify the skin tone as a memory color. In some embodiments, in addition to detecting face 404, the processing module can trigger a detection module (e.g., a face detection and/or recognition module such as detection module 110 of FIG. 1) to confirm the identification of the memory color (e.g., confirming the detection of face 404).

Figure 4B:
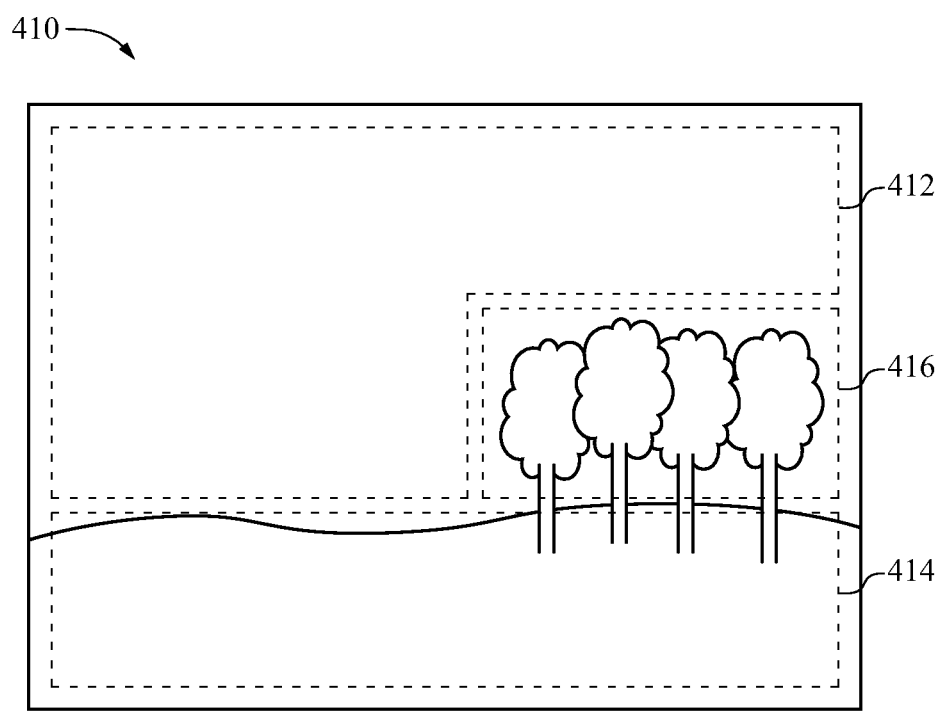

As another example, as shown in FIG. 4B, image 410 includes a landscape scene, which may be captured by a production unit of an image sensor (e.g., image sensor 102 of FIG. 1 and/or image sensor 200 of FIG. 2). A processing module (e.g., processing module 104 of FIG. 1 and/or processing module 300 of FIG. 3) can detect a large area 412 located in the upper one-third of image 410 that has a smooth texture and an increased brightness level. Thus, the processing module may determine that area 412 corresponds to sky. Similarly, the processing module can detect areas 414 and 416 in the lower and middle parts of image 400 that have a relatively rough texture and a middle tone. Thus, the processing module may determine that areas 414 and 416 correspond to foliage (e.g., trees and grass). Persons skilled in the art will appreciate that these are merely illustrative examples, and that a processing module can use any suitable conditions to determine the presence of one or more memory colors.

In other embodiments, the processing module can collect one or more memory colors in an image in a semi-automatic fashion. For example, the memory colors can be generated from user-captured images. Thus, in one embodiment, the processing module can transmit information to a user of the image system. The information can include a request to capture an image that corresponds to one or more memory colors.

Figure 5:
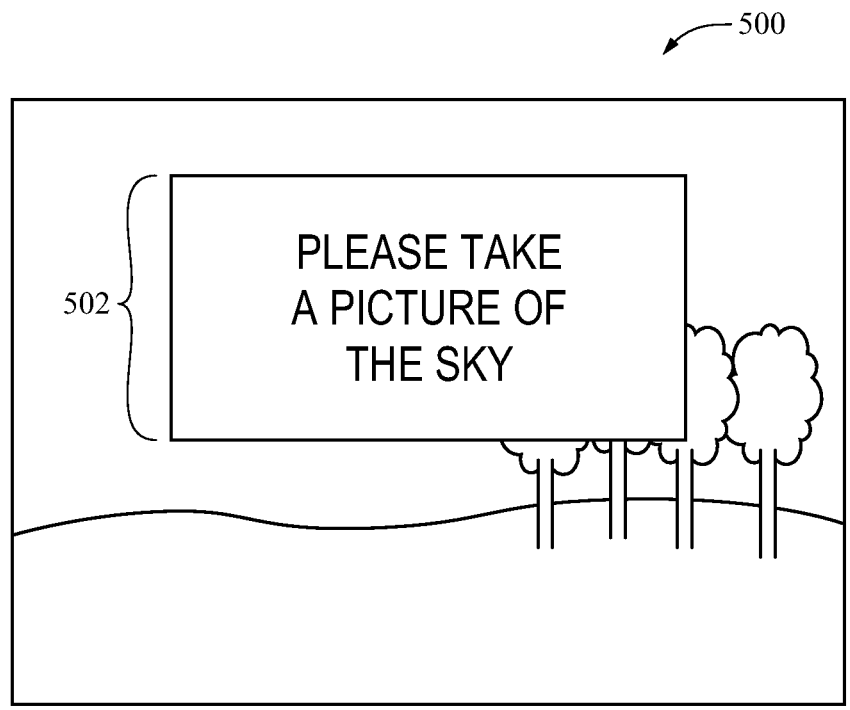
FIG. 5 is a display screen associated with transmitting information to a user in accordance with various embodiments of the invention.

For example, FIG. 5 shows display screen 500, which may be associated with transmitting information to a user. A processing module (e.g., processing module 104 of FIG. 1 and/or processing module 300 of FIG. 3) can display the information (e.g., message 502) on a display (e.g., display 106 of FIG. 1). The display may be, for example, a LCD display on a camera, a display or a touch screen on a cellular phone, or a computer display. In some embodiments, message 502 may be overlaid on top of one or more images that are being captured by a production unit of an image sensor (e.g., image sensor 102 of FIG. 1 and/or image sensor 200 of FIG. 2).

For example, as shown in display screen 500, the information can include a request for a user to capture an image of the sky. It will be understood that the information can include a request to capture any suitable image(s) including, for example, a human face, trees, a piece of white paper, and/or any other images that can correspond to one or more memory colors. In some cases, message 502 may be removed after a pre-determined period of time (e.g., 5 seconds).

Returning to FIG. 3, in response to collecting and identifying one or more memory colors, processing module 300 can collect the responses of a production unit of an image sensor (e.g., production sensor responses) that are associated with the more or more memory colors. Thus, over a period of time, processing module 300 can collect a large database of production sensor responses for the one or more memory colors. In some embodiments, for each of the one or more memory colors, processing module 300 can determine if the total collected responses for a memory color converge to a pre-determined range. If the total collected responses converge to a pre-determined range (e.g., a range that satisfies a particular confidence level), processing module 300 can determine that the memory color has been accurately identified.

In response to determining that a memory color has been accurately identified, processing module 300 can begin to perform color correction of a new image captured by a production unit of the image sensor for that memory color. For example, processing module 300 may determine that the target sensor responses (obtained offline) of the memory color for sky have red-green-blue ("RGB") values of 200, 200, and 255, respectively. Processing module 300 can then compare the target sensor responses with production sensor responses determined for the same memory color in a newly captured image. Thus, if, for the sky, the production sensor responses of a production unit have RGB values of 255, 255, and 200, respectively, processing module 300 may determine that there are production variations in the production unit. Then, as discussed previously, processing module 300 can perform color correction (e.g., local and/or global calibrations) of the production unit based on the target and production sensor responses (e.g., by generating target and production color ratios and adjusting for production variations). In some embodiments, because the identification of one or more memory colors is unnecessary for the local calibration process, processing module 300 can perform the local calibration process prior to identifying one or more memory colors.

In some embodiments, production sensor responses collected for different memory colors can be weighed based on their corresponding confidence level. For example, if a particular memory color has relatively inconsistent production sensor responses (and therefore a low confidence level), processing module 300 can assign a lower weight for each subsequent identification of the memory color. As a result, it may take a longer amount of time before processing module 300 will begin to perform a global calibration process for that particular memory color. As another example, if a particular memory color has been captured by a user, processing module 300 can assign a higher weight to the corresponding production sensor responses because the memory color is more likely to be correct. As yet another example, processing module 300 can weigh production sensor responses based on the number and/or types of conditions that have been satisfied for a particular memory color.

Since the collection of production sensor responses is a continuous process, further adjustments to the identification of a memory color can be performed if subsequent production sensor responses indicate that the initial calibrations can be improved. Moreover, processing module 300 can maintain color rendering quality over the lifetime of a production unit of an image sensor by monitoring for any drifts in the production sensor responses and correcting for these drifts.

In some embodiments, in addition to or instead of calibrating for production variations of a CFA (e.g., CFA 214 of FIG. 2), a processing module (e.g., processing module 104 of FIG. 1 and/or processing module 300 of FIG. 3) can also identify other causes of production variations in a production unit of an image sensor. For example, one or more components of a processing module (e.g., target CFA module 302 of FIG. 3, production CFA module 304 of FIG. 3, calibration module 306 of FIG. 3, and/or digital processing module 308 of FIG. 3) can determine whether the cause of production variations is related to production variations of a CFA or production variations of an IR cutoff filter (e.g., IR cutoff filter 212 of FIG. 2).

For instance, because color pixels (e.g., red, green, and blue pixels) and reference pixels may have different responses to long-wavelength visible light, the behaviors of color and reference pixels may be affected differently by variations in the IR cutoff filter spectrum. In particular, patterns in the different behaviors of the color and reference pixels may create a signature providing information of the nature of the variations in the IR filter spectrum. By determining the root cause of production variations, the processing module can further improve color processing and auto-white balancing during later stages of digital processing (e.g., digital processing performed by digital processing module 308 of FIG. 3).

Figure 6:
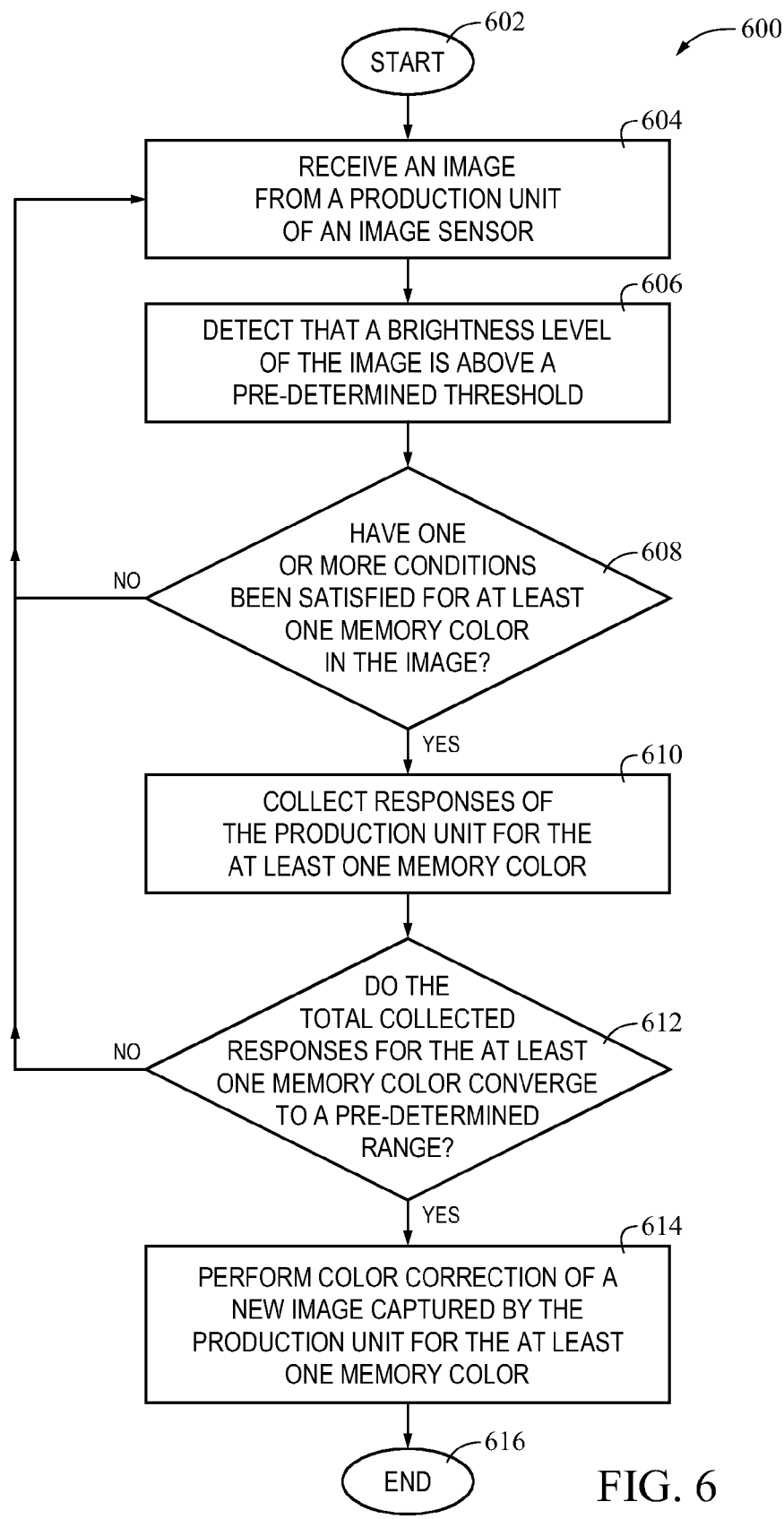
FIG. 6 is a flowchart of an illustrative process for adjusting values of one or more color pixels of an image sensor in accordance with various embodiments of the invention.
Figure 7:
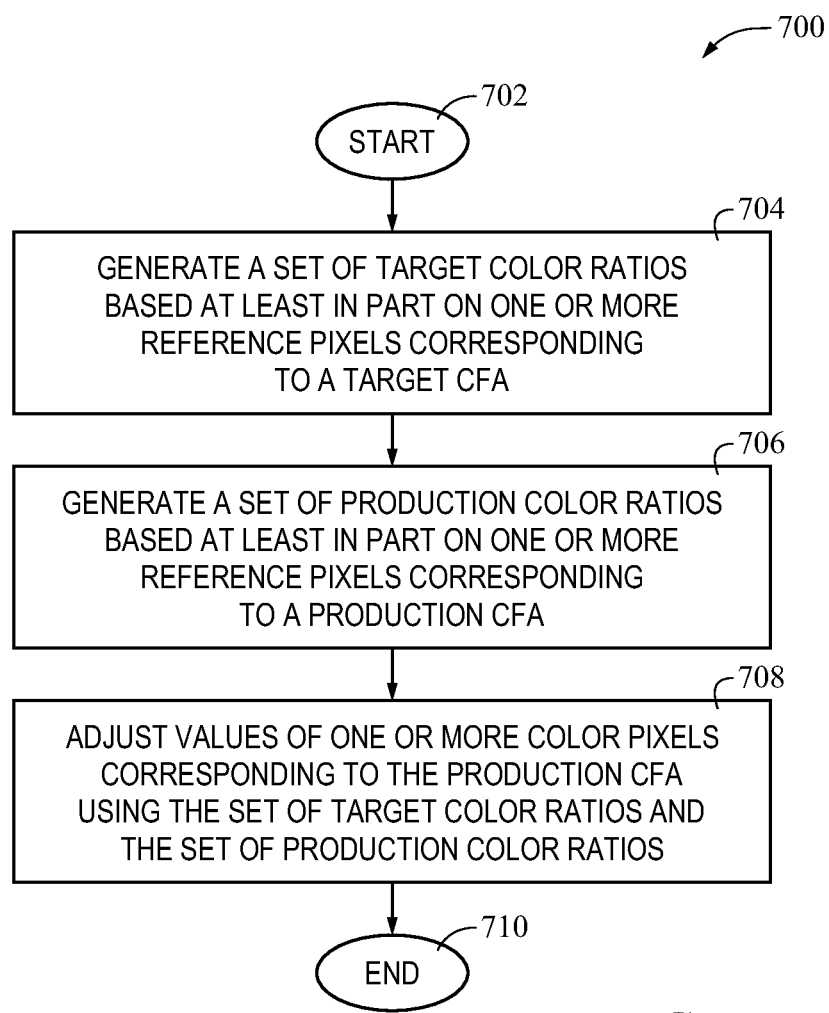
FIG. 7 is a flowchart for collecting image sensor responses of memory colors in accordance with various embodiments of the invention.

FIGS. 6 and 7 are flowcharts of illustrative processes that can be executed by a processing module to achieve some of the above-described features and functionalities. In particular, the processes may be executed by a processing module of an image system (e.g., image system 100 of FIG. 1) configured in accordance with embodiments of the invention, such as processing module 104 of FIG. 1 and/or processing module 300 of FIG. 3. Moreover, any suitable component(s) of the processing module can execute any of the steps of the processes of FIGS. 6 and 7 such as, for example, target CFA module 302 (FIG. 3), production CFA module 304 (FIG. 3), calibration module 306 (FIG. 3), and/or digital processing module 308 (FIG. 3). It should be understood that these processes are merely illustrative, and that any steps can be removed, modified, combined, or any other steps may be added, without departing from the scope of the invention.

Turning first to FIG. 6, a flowchart of an illustrative process 600 is shown for collecting production sensor responses of memory colors. Although the steps of process 600 are described as being executed generally by a processing module (e.g., processing module 104 of FIG. 1 and/or processing module 300 of FIG. 3), it should be understood that any suitable module(s) or component(s) of the processing module (e.g., target CFA module 302, production CFA module 304, calibration module 306, and/or digital processing module 308 of FIG. 3) may execute these steps.

Process 600 may start at step 602, where the processing module may have already begun to collect responses of a production unit of an image sensor (e.g., image sensor 102 of FIG. 1 and/or image sensor 200 of FIG. 2) for one or more memory colors. Then, at step 604, the processing module can receive an image from the production unit (e.g., an image that has been captured by the production unit).

Continuing to step 606, the processing module can detect that a brightness level of the image is above a pre-determined threshold. For example, the processing module may determine that an image system (e.g., image system 100 of FIG. 1) is a portable camera or a cellular phone. Responsive to this determination, the processing module can detect when the brightness level of the image has reached a pre-determined threshold corresponding to daylight. As another example, the processing module may determine that the image system is a computer camera. In such a case, the processing module can detect when the brightness level has reached a pre-determined threshold corresponding to a sufficient amount of artificial light (e.g., a combination of fluorescent light, tungsten light, and/or the light emitted from a display, such as display 106 of FIG. 1). Thus, daylight and artificial light can both function as suitable light sources. By detecting the presence of a suitable light source, the processing module can ensure that relatively stable color behavior can be produced by the production unit.

At step 608, the processing module can determine whether one or more conditions have been satisfied for at least one memory color in the image. The one or more conditions can include, for example, an initial set of color ratios (e.g., $[R_{prod}/C_{prod}, G_{prod}/C_{prod}, B_{prod}/C_{prod}, R_{prod}/G_{prod}, B_{prod}/G_{prod}]$), a location and/or size within an image, a brightness level of the image, an exposure time, a texture of the image (e.g., color uniformity of the memory color), an output of a detection module (e.g., detection module 110 of FIG. 1), any other suitable condition, and/or any combination thereof. Thus, the processing module can identify the at least one memory color if the memory color satisfies the one or more conditions.

If, at step 608, the processing module determines that one or more conditions have not been satisfied for at least one memory color in the image, process 606 may return to step 604. At step 604, the processing module can continue to receive images from the production unit. After receiving these images, the processing module can determine if at least one memory color has been detected.

If, at step 608, the processing module instead determines that one or more conditions have been satisfied for at least one memory color in the image, process 600 can move to step 610. At step 610, the processing module can collect responses of the production unit (e.g., production sensor responses) for the at least one memory color. When this response of the production unit is combined with previously collected responses of the production unit, the processing module may be able to generate a large database of production sensor responses that are associated with the at least one memory color.

Then, at step 612, the processing module can determine whether the total collected responses for the at least one memory color converge to a pre-determined range (e.g., a range that satisfies a particular confidence level). If, at step 612, the processing module determines that the total collected responses of the production unit do not converge to a pre-determined range (e.g., the pre-determined range does not yet satisfy a particular confidence level), process 600 may return to step 604. At step 604, the processing module can continue to receive images from the production unit and determine if at least one memory color has been detected.

If, at step 612, the processing module instead determines that the total collected responses of the production unit converge to a pre-determined range, process 600 may move to step 614. At step 614, the processing module can perform color correction of a new image captured by the production unit for the at least one memory color. For example, the processing module can compare target sensor responses of the at least one memory color with the production sensor responses determined for the same memory color in the new image. If there are differences between the target sensor responses and the production sensor responses, the processing module can perform global calibration based on the two responses. For instance, the processing module can generate target and production color ratios (e.g., as provided in Equations (2) and (3)) and adjust for production variations (e.g., as provided in Equations (4)-(6)). Process 600 may then end at step 616.

Turning now to FIG. 7, a flowchart of an illustrative process 700 is shown for adjusting values of one or more color pixels of a production unit of an image sensor. In some embodiments, process 700 can represent a more detailed view of color correction step 614 of process 600 (FIG. 6).

Process 700 may begin at step 702. At step 704, a target CFA module (e.g., target CFA module 302 of FIG. 3) can generate a set of target color ratios based at least in part on one or more reference pixels corresponding to a target CFA. The target CFA can be a CFA of a target unit of an image sensor (e.g., image sensor 102 of FIG. 1 and/or image sensor 200 of FIG. 2). As discussed previously, the target CFA may not include any production variations. In some embodiments, the one or more reference pixels can be clear pixels with a clear coating material in corresponding portions of the target CFA. In other embodiments, the one or more reference pixels can be neutral density pixels that have a neutral density coating material in corresponding portions of the target CFA.

In some embodiments, the target CFA module can generate the set of target color ratios for a pre-determined memory color based on Equation (2). In some embodiments, the set of target color ratios can be generated offline.

Continuing to step 706, a production CFA module (e.g., production CFA module 304 of FIG. 3) can generate a set of production color ratios based at least in part on one more reference pixels corresponding to a production CFA. The production CFA can be a CFA of a production unit of an image sensor (e.g., image sensor 102 of FIG. 1 and/or image sensor 200 of FIG. 2). Correspondingly, the production CFA may include production variations. In some embodiments, the one or more reference pixels can be clear pixels with a clear coating material in corresponding portions of the production CFA (e.g., portion 218). In other embodiments, the one or more reference pixels can be neutral density pixels that have a neutral density coating material in corresponding portions of the production CFA (e.g., portion 218).

Similar to the target CFA module, the production CFA module can generate the set of production color ratios for a pre-determined memory color based on Equation (3). In some embodiments, the production CFA module can generate the set of production color ratios in real time.

Then, at step 708, a calibration module (e.g., calibration module 306 of FIG. 3) can adjust the values of one or more color pixels corresponding to the production CFA using the set of target color ratios and the set of production color ratios. For example, as provided in Equation (4), the calibration module can divide the set of target color ratios by the set of production color ratios to generate one or more multipliers. In addition, the calibration module can multiply each value of the one or more color pixels by a corresponding multiplier of the one or more multipliers.

The calibration module can adjust the values of the one or more color pixels at any suitable time. For example, the calibration module can adjust the values during a manufacturing process of a production unit. As another example, the calibration module can automatically adjust the values in response to detecting that the production unit has acquired one or more images. As yet another example, the calibration module can adjust the values in response to receiving a calibration request. The calibration request may be received from any suitable source including, for example, a user of the image system, any suitable component of the processing module, and/or any suitable module of the image system.

After adjusting the values of one or more color pixels, process 700 may end at step 710.

In conclusion, systems and methods are provided for calibrating image sensors. For example, a production unit of an image sensor and/or image system may include a production CFA and/or an IR cutoff filter with different types of production variations. These production variations can cause the production unit to have different sensor responses (e.g., production sensor responses) as compared to a target unit of the image sensor (e.g., target sensor responses).

In some embodiments, a processing module can calibrate a production unit of an image sensor using one or more reference pixels without color filter coatings or with minimal color filtration. The one or more reference pixels may be one or more clear pixels and/or one or more neutral density pixels of an image sensor. Because the reference pixels are unaffected by production variations of a production CFA (e.g., imperfections in the CFA coatings), the processing module can use the reference pixels to calibrate for these production variations.

By using reference pixels to calibrate a production unit of an image sensors, production variations can be corrected without having to use a light source with uniform brightness or special targets. Instead, image sensor calibrations can be performed using only uniformly-colored image areas and/or one or more memory colors. In some cases, the image areas can be generated from user-captured images containing the one or more memory colors.

In some embodiments, the processing module may perform local calibration by correcting specifically for spatial variations in the CFA coatings. Thus, a calibration module of the processing module can correct for the spatial variations using the one or more reference pixels. For example, the calibration module can produce a gain map that may reflect spatial variations in the CFA coatings (e.g., the gain map can vary over one or more areas of a calibration image). In some cases, the calibration image may be taken by a user of the image system.

Then, the calibration module can adjust for spatial variations of a production unit of an image sensor using the gain map. For example, the calibration module can adjust the gains of each pixel of an image captured by the production unit. As a result, the production sensor responses can have little or no spatial variations for a relatively uniform area of the image.

In some embodiments, the processing module may perform global calibration of an image. In order to perform global calibration, a target CFA module of the processing module can generate target data (e.g., a set of target color ratios) based on sensor responses of a target unit of an image sensor (e.g., target sensor responses). In addition, the target data can correspond to a pre-determined input (e.g., a pre-determined memory color associated with a particular light source) and can be based at least in part on one or more reference pixels. For the same pre-determined input, a production CFA module can generate production data (e.g., a set of production color ratios) based on sensor responses of a production unit of the image sensor.

Then, based on the target and production data, a calibration module of the image system can perform global calibration for images captured by a production unit of the image sensor. For example, based on the target and production color ratios, the calibration module can adjust the values of one or more color pixels of the production unit.

In order to perform the global calibration process, the processing module can attempt to collect and identify one or more memory colors using any suitable approach. In some embodiments, the processing module can attempt to identify a memory color automatically based on whether the memory color satisfies one or more conditions. The one or more conditions can include, for example, an initial set of color ratios, a location and/or size within an image, a brightness level of the image, an exposure time, a texture of the image (e.g., color uniformity of the memory color), an output of a detection module, any other suitable condition, and/or any combination thereof. In other embodiments, the processing module can attempt to identify the one or more memory colors in a semi-automatic fashion. For example, the processing module can transmit information to a user of the image system. The information can include a request to capture an image that corresponds to one or more memory colors.

In some embodiments, image sensor calibrations can be performed by the processing module of the image system at any suitable time. For example, the processing module can perform per module calibration while a production unit is being manufactured. As another example, the processing module can automatically perform a self-calibration process after a production unit of an image sensor has already been integrated into an end product system (e.g., an electronic device such as, for instance, a cellular phone, a camera, or a personal computer).

In some embodiments, one or more components of a processing module can determine whether the cause of production variations is related to production variations of a production CFA or production variations of an IR cutoff filter. In some embodiments, one or more components of a processing module can perform gain adjustments of one or more pixels of a production unit of an image sensor.

The described embodiments of the invention are presented for the purpose of illustration and not of limitation.

What is claimed is:

1. A method for calibrating a production unit of an image sensor, comprising:
    generating data based at least in part on one or more reference pixels of a pixel array of the production unit, wherein the reference pixels have minimal color filtration; and
    adjusting for production variations of a color filter array associated with one or more color pixels of the pixel array of the production unit using the data,
    wherein the generating data comprises generating a set of color ratios based at least in part on the one or more color pixels and calculating a gain map representative of variations of the color filter array, wherein the gain map includes a set of production color ratios relating the one or more color pixels to the reference pixels, said color ratios of the gain map of the form:

$[X1prod/Cprod, X2prod/Cprod, \ldots XNprod/Cprod]$ where X1prod, X2prod ... XNprod, and Cprod correspond to production sensor responses of the one or more color pixels of the production unit of the image sensor, and the reference pixel, respectively.

2. The method of claim 1, wherein the one or more reference pixels corresponds to one or more clear pixels that have a clear coating material in corresponding portions of the color filter array.

3. The method of claim 1, wherein the one or more reference pixels corresponds to one or more neutral density pixels that have a neutral density coating material in corresponding portions of the color filter array, wherein the neutral density coating material attenuates light.

4. The method of claim 1, wherein the one or more reference pixels are one or more imaging pixels embedded in a pixel array of the production unit.

5. The method of claim 1, wherein the gain map includes a color ratio for each color pixel of the one or more color pixels of the pixel array.

6. The method of claim 1, wherein the one or more reference pixels is associated with a reference integration time that is different from a color integration time that is associated with the one or more color pixels.

7. The method of claim 1, wherein the data comprises a set of target color ratios based at least in part on sensor responses of a target unit of the Image sensor.

8. The method of claim 1, wherein
    calculating the gain map includes calculating the gain map that varies over one or more areas of an image; and
    wherein the adjusting includes adjusting for spatial variations of the color filter array of the production unit using the gain map.

9. The method of claim 8, wherein the gain map comprises one or more planes, wherein each plane of the one or more planes corresponds to a particular color channel.

10. The method of claim 8, further comprising storing the gain map in memory.

11. The method of claim 1, wherein calculating the gain map also includes the form:

$[Rprod/Cprod, Gprod/Cprod, Bprod/Cprod]$, where Rprod, Gprod, Bprod correspond to production sensor responses of the production unit of the image sensor for red, green and blue channels, respectively and Cprod corresponds to production sensor responses of the reference channel.

12. The method of claim 11, wherein Rprod, Gprod, Bprod and Cprod, correspond to unique responses of the red, green, blue and reference pixels in a pixel array of the production unit of the image sensor.

13. The method of claim 1 further including configuring an image system to perform the steps of claim 1 including the generating data step and the adjusting step.

14. A method for calibrating a production unit of an image sensor, comprising:
    generating data based at least in part on one or more reference pixels of a pixel array of the production unit, wherein the reference pixels have minimal color filtration and
    adjusting for production variations of a color filter array associated with one or more color pixels of the pixel array of the production unit using the data,
    wherein the generating data comprises generating a set of color ratios based on the one or more color pixels and the one or more reference pixels and generating the set of color ratios, including target color ratios, for a pre-determined memory color, wherein the set of target color ratios is based on:

$[X1target/Ctarget, X2target/Ctarget, \ldots XNtarget/Ctarget]$, where X1target, X2target, ... XNtarget and Ctarget correspond to target sensor responses for the one or more color pixels, and the reference pixel, respectively.

15. The method of claim 14, wherein generating the data includes generating the data wherein the one or more reference pixels corresponds to one or more clear pixels that have a clear coating material in corresponding portions of the color filter array.

16. The method of claim 14, wherein generating the data includes generating the data wherein the one or more reference pixels corresponds to one or more neutral density pixels that have a neutral density coating material in corresponding portions of the color filter array, wherein the neutral density coating material attenuates light.

17. The method of claim 14, wherein generating the data includes generating the data wherein the one or more reference pixels are one or more imaging pixels embedded in a pixel array of the production unit.

18. The method of claim 14, wherein generating the data includes generating the data wherein the one or more reference pixels are one or more calibration pixels embedded in the production unit.

19. The method of claim 14, wherein generating the data includes generating the data wherein the one or more reference pixels is associated with a reference integration time that is different from a color integration time that is associated with the one or more color pixels.

20. The method of claim 14, wherein generating the data includes generating the data wherein the data comprises a set of target color ratios based at least in part on sensor responses of a target unit of the image sensor.

21. The method of claim 14, wherein the adjusting comprises: calculating a gain map, wherein the gain map varies over one or more areas of an image; and adjusting for spatial variations of the production unit using the gain map.

22. The method of claim 21, wherein the gain map comprises one or more planes, wherein each plane of the one or more planes corresponds to a particular color channel.

23. The method of claim 14, wherein generating the color ratios includes the set of target color ratios based on:

$$[R_{target}/C_{target}, B_{target}/C_{target}, G_{target}/C_{target}],$$

where Rtarget, Gtarget, Btarget and Ctarget correspond to target sensor responses for red, green and blue, channels, respectively, and Ctarget corresponds to target sensor responses for the reference channel.

24. The method of claim 23, wherein Rtarget, Gtarget, Btarget and Ctarget correspond to average pixel values for the red, green, blue and reference channels, respectively.

25. The method of claim 14 further including configuring an image system to perform the steps of claim 14 including the generating data step and the adjusting step.

* * * * *